(12) United States Patent
Jung

(10) Patent No.: US 7,270,937 B2
(45) Date of Patent: Sep. 18, 2007

(54) OVER-COATING COMPOSITION FOR PHOTORESIST AND PROCESS FOR FORMING PHOTORESIST PATTERN USING THE SAME

(75) Inventor: Jae Chang Jung, Seoul (KR)

(73) Assignee: Hynix semiconductor Inc., Kyungki-do (KR)

( * ) Notice: Subject to any disclaimer, the term of this patent is extended or adjusted under 35 U.S.C. 154(b) by 250 days.

(21) Appl. No.: 10/875,853

(22) Filed: Jun. 24, 2004

(65) Prior Publication Data

US 2005/0084795 A1    Apr. 21, 2005

(30) Foreign Application Priority Data

Oct. 17, 2003   (KR) ............... 10-2003-0072690
Oct. 17, 2003   (KR) ............... 10-2003-0072691

(51) Int. Cl.
*G03F 7/11*    (2006.01)
*G03F 7/30*    (2006.01)

(52) U.S. Cl. ............... 430/273.1; 430/330; 430/326; 430/325; 430/296; 430/967

(58) Field of Classification Search .............. None
See application file for complete search history.

(56) References Cited

U.S. PATENT DOCUMENTS

| | | | | |
|---|---|---|---|---|
| 3,895,949 A | * | 7/1975 | Akamatsu et al. | 430/273.1 |
| 4,305,859 A | * | 12/1981 | McEwan et al. | 524/804 |
| 4,766,012 A | * | 8/1988 | Valenti | 427/213.36 |
| 5,212,043 A | | 5/1993 | Yamamoto et al. | |
| 5,240,812 A | * | 8/1993 | Conley et al. | 430/273.1 |
| 5,326,675 A | * | 7/1994 | Niki et al. | 430/326 |
| 5,356,988 A | * | 10/1994 | Nothnagel | 524/556 |
| 5,750,680 A | | 5/1998 | Kim et al. | |
| 5,783,362 A | * | 7/1998 | Wakiya et al. | 430/273.1 |
| 6,051,678 A | | 4/2000 | Kim et al. | |
| 6,066,432 A | * | 5/2000 | Yanaka | 430/273.1 |
| 6,132,926 A | | 10/2000 | Jung et al. | |
| 6,143,463 A | | 11/2000 | Jung et al. | |
| 6,150,069 A | | 11/2000 | Jung et al. | |
| 6,180,316 B1 | | 1/2001 | Kajita et al. | |

(Continued)

FOREIGN PATENT DOCUMENTS

EP    0 789 278 A2    8/1997

(Continued)

OTHER PUBLICATIONS

Dietz, Karl, Circuitree, Tech Talk: Fine Lines in High Yeild (part LVII); Wet Lamination of Dry film Photoresi, www.cricuitree.com;CDA/Archives, Jul. 1, 2000, 11 pages.*

(Continued)

*Primary Examiner*—Cynthia Hamilton
(74) *Attorney, Agent, or Firm*—Marshall, Gerstein & Borun LLP

(57) ABSTRACT

Overcoating compositions for a photoresist and methods of using the same are disclosed. More specifically, overcoating compositions for a photoresist comprising materials which can weaken acid stably are disclosed. These materials neutralize large amounts of acid produced in the upper portion of a photoresist film, thereby uniformizing vertical distribution of the acids. As a result, vertical and fine patterns of less than 100 nm thickness can be obtained.

10 Claims, 8 Drawing Sheets

U.S. PATENT DOCUMENTS

| | | |
|---|---|---|
| 6,225,020 B1 | 5/2001 | Jung et al. |
| 6,235,447 B1 | 5/2001 | Lee et al. |
| 6,235,448 B1 | 5/2001 | Lee et al. |
| 6,929,895 B2 * | 8/2005 | Maemoto et al. ........... 430/138 |
| 2001/0003030 A1 * | 6/2001 | Jung et al. ............... 430/273.1 |

FOREIGN PATENT DOCUMENTS

| | | |
|---|---|---|
| EP | 0 794 458 A2 | 9/1997 |
| GB | 2 345 286 A | 7/2000 |
| JP | 06-202329 | 7/1994 |
| JP | 08-190193 | 7/1996 |
| JP | 8-305022 | 11/1996 |
| JP | 10-010743 | 1/1998 |
| JP | 11-327162 | 11/1999 |
| KR | 10-1997-0028843 | 6/1997 |
| KR | 10-2001-0036722 | 5/2001 |
| KR | 10-2001-0053839 | 7/2001 |
| WO | WO96/37526 | 11/1996 |
| WO | WO97/33198 | 9/1997 |

OTHER PUBLICATIONS

Deionized water-Wikipedia, the free encyclopedia, two pages dated Jun. 28, 2006.☐☐.*

CalGOLD, Pollution Prevention (P2) for Printed Circuit Board Manufactureing 3672 from www.calgold, ca.gov?P2/3672.htm, 3 pages 3, source date listed 1989.*

Electrovert Solder Technology Glossary, Speedline technologies, 17 pages, 2004 copyright date.*

Wilson, et al , AN 1995:814081, Entered STN Sep. 27, 1995, from CAPLUS, ACS on STN, one page abstract of "Resist materisl design: bas-catalyzed chemical amplification" from Report (1994).*

Official action issued in corresponding Chinese application No. 2004100635699 dated Mar. 31, 2006.

* cited by examiner

OVER-COATING COMPOSITION FOR PHOTORESIST AND PROCESS FOR FORMING PHOTORESIST PATTERN USING THE SAME

BACKGROUND

1. Technical Field

The present invention relates to over-coating compositions for a photoresist. More specifically, vertical and fine patterns can be obtained by using over-coating compositions containing acid-weakening materials even when light absorbance to a light source of photoresist is relatively high.

2. Background of the Related Art

In a process for manufacturing semiconductor fine circuits using KrF (248 nanometers (nm)), fine circuits of 150 nm L/S have already been formed, and patterns of less than 150 nm are currently required. Meanwhile, studies have been made on the fine circuit manufacturing process using light sources of low wavelength such as ArF (193 nm), $F_2$ (157 nm), EUV (Extremely Ultraviolet; 13 nm). However, it is difficult to develop photoresist resins having excellent transmittance to these wavelengths. For example, photoresist resins used in I-line (365 nm) and KrF (248 nm) contain aromatic compounds and they cannot be used at 193 nm because its light absorbance to 193 nm is excessively high. As a result, photoresists for 193 nm wavelength have been introduced by using acrylic or alicyclic resins, which do not include aromatic compounds. However, it is difficult to form good patterns by using these resins due to their high light absorbance to 193 nm.

FIG. 1a is a cross-sectional diagram of a photoresist pattern obtained when absorbance to a light source is low. Since the amount of light which reaches the upper portion and the lower portion of the photoresist film coated on a wafer is substantially the same, vertical patterns can be obtained. However, as shown in FIG. 1b, when absorbance to a light source is high, the amount of light which reaches the upper portion of the photoresist film is larger than that of the lower portion, thus the amount of acids generated from the upper portion is larger than that of the lower portion in the case of a chemical amplification type photoresist. Therefore, slant patterns after development may be formed as shown in FIG. 1b. That is, slant patterns are formed because the concentration gradient of acids generated by the light exposure is different depending on the height in a vertical direction.

In order to overcome the above-described problem, studies have been focused on developing resins having low light absorbance to a light source. However, the development of these resins reaches a limitation when light sources such as $F_2$ (157 nm) or EUV (13 nm) are used.

A resist flow process or an alkali treatment process may be introduced to form patterns having fine sizes beyond exposure limitation. However, when the resist flow process is performed, the size of the first formed contact hole is not the same after the flow process, and is varied depending on the density and the size of the contact hole. The alkali treatment process causes deformation of the contact hole due to irregular diffusion of alkali compounds.

SUMMARY OF THE DISCLOSURE

Accordingly, the present inventors have made efforts to overcome the above problems and have developed over-coating compositions comprising acid-weakening materials and obtained vertical and stable fine patterns using these compositions in spite of light absorbance to a light source of photoresist resins.

Disclosed herein are over-coating compositions for a photoresist. Generally, the composition includes (i) a crown-ether compound or a salt compound represented by Formula 1, (ii) an alkali soluble resin including a repeating unit represented by Formula 2, and (iii) distilled water:

[Formula 1]

[Formula 2]

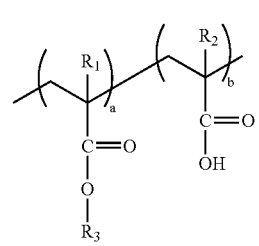

wherein

X is a primary, secondary, or tertiary amine;

Y is a carboxylate or halogen element;

$R_1$ and $R_2$ are individually hydrogen or a methyl group;

$R_3$ is a linear or branched $C_1$-$C_{10}$ alkyl group; and the relative ratio of a:b=2-20 mol %:80-90 mol %.

Also disclosed herein are processes for forming vertical and stable fine patterns even when light absorbance to a light source of photoresist resins is relatively high. The process generally includes coating an alkali-insoluble, chemical-amplification type photoresist composition on a wafer to form a photoresist film. The process also includes coating the over-coating composition on the entire surface of the photoresist film to form an over-coating layer, exposing the resulting structure to light, and developing the resulting structure to obtain a desired ultrafine pattern.

DETAILED DESCRIPTION OF THE PRESENTLY PREFERRED EMBODIMENTS

The present invention provides processes for forming vertical and fine patterns of less than 100 nm even when light absorbance to a light source of photoresist resins is relatively high.

Also, the present invention provides over-coating compositions comprising crown-ether compounds or salt compounds for stably weakening acids which are applicable to the process mentioned above.

Specifically, an over-coating composition for a photoresist includes (i) a crown-ether compound or a salt compound represented by Formula 1, (ii) an alkali soluble resin including a repeating unit represented by Formula 2, and (iii) distilled water:

[Formula 1]

$X^+ {}^-Y$

[Formula 2]

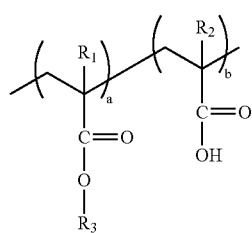

wherein

X is a primary, secondary, or tertiary amine;

Y is a carboxylate or halogen element;

$R_1$ and $R_2$ are individually hydrogen or a methyl group;

$R_3$ is a linear or branched $C_1$-$C_{10}$ alkyl group; and the relative ratio of a:b=2-20 mol %:80-90 mol %.

Preferably, the crown-ether compound is selected from the group consisting of 18-crown-6-ether, 15-crown-2-ether or 12-crown-4-ether represented by Formulas 3a, 3b, and 3c, respectively:

[Formula 3a]

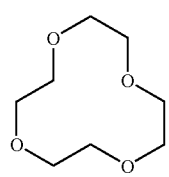

18-crown-6-ether

[Formula 3b]

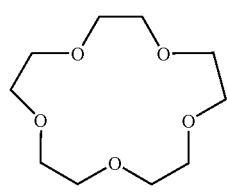

15-crown-5-ether

[Formula 3c]

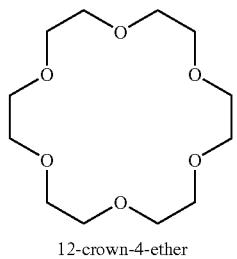

12-crown-4-ether

Preferably, the salt compound of Formula 1 is selected from the group consisting of a salt of $NEt_3$ and $CH_3CO_2H$ ($Et_3N^+$ $^-O_2CCH_3$), and a salt of $NEt_3$ and HCl ($Et_3N^+$ $^-Cl$). The alkali soluble resin preferably includes a resin including the repeating unit selected from poly(acrylic acid/methyl acrylate) or poly(acrylic acid/methyl methacrylate).

The crown-ether compound or the salt compound is present in an amount ranging from 0.1 weight percent (wt %) to 10 wt %, preferably from 0.12 wt % to 2 wt %, based on the total amount of the composition, and the alkali soluble resin is present in an amount ranging from 1 wt % to 10 wt %, preferably from 2 wt % to 3 wt %, based on the total amount of the composition.

The principle of obtaining vertical and fine patterns by using the over-coating composition of the present invention is as follows.

Figure 1A:
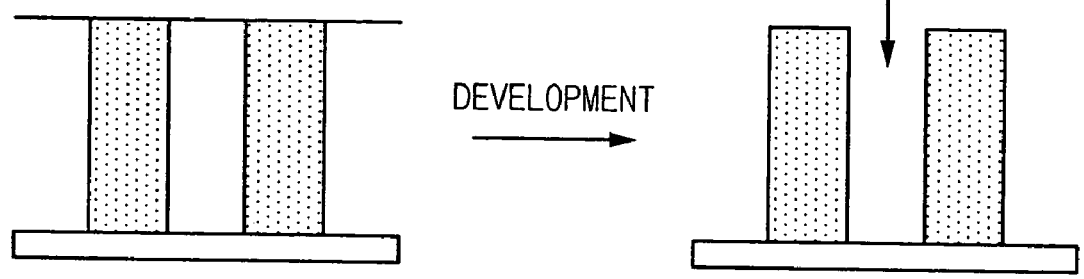
FIG. 1a is a cross-sectional diagram of a photoresist pattern obtained when light absorbance is very low to a light source of photoresist.
Figure 1B:
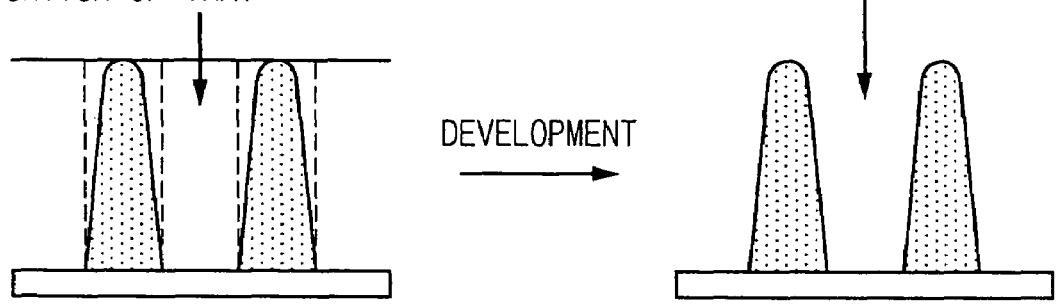
FIG. 1b is a cross-sectional diagram of a photoresist pattern obtained when light absorbance is relatively high to a light source of photoresist.

When the transmittance of a photoresist is low, a larger amount of acid is generated in the lower portion than in the upper portion of a photoresist film (see FIG. 1b). The crown-ether compound or the salt compound of Formula 1 included in the over-coating composition of the present invention is uniformly diffused into the lower portion of the photoresist film, and neutralizes the upper portion of the photoresist film having relatively large amount of acid. That is, the amount of diffused crown-ether compound or diffused salt compound becomes larger in the upper portion than in the lower portion of the photoresist film, because of the uniform diffusion of such crown-ether compound or salt compound. As a result, vertical distribution of acids in the photoresist film becomes uniform, thereby obtaining vertical and fine patterns.

A process for forming a photoresist pattern includes the steps of:

(a) coating an alkali-insoluble, chemical-amplification type photoresist composition on a wafer to form a photoresist film;

(b) coating the over-coating composition of the present invention on the entire surface of the photoresist film to form an over-coating layer;

(c) exposing the resulting structure to light; and, (d) developing the resulting structure to obtain a desired ultrafine pattern.

The above-described process may further include forming an organic-scattered, reflection-protecting film on the top portion of the underlying layer to be etched before forming a photoresist film in the step (a).

The photoresist composition of the present invention can comprise any of chemical amplification type polymers including, for example, polymers disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0 789 278 (Aug. 13, 1997), U.S. Pat. No. 5,750,680 (May 12, 1998), U.S. Pat. No. 6,051,678 (Apr. 18, 2000), GB 2,345,286 A (Jul. 5, 2000), U.S. Pat. No. 6,132, 926 (Oct. 17, 2000), U.S. Pat. No. 6,143,463 (Nov. 7, 2000), U.S. Pat. No. 6,150,069 (Nov. 21, 2000), U.S. Pat. No. 6,180,316 B1 (Jan. 30, 2001), U.S. Pat. No. 6,225,020 B1 (May 1, 2001), U.S. Pat. No. 6,235,448 B1 (May 22, 2001) and U.S. Pat. No. 6,235,447 B1 (May 22, 2001). The alkali-insoluble, chemical-amplification type photoresist polymer used in the present photoresist composition preferably includes any one selected from the group consisting of a polymer having additionally polymerized cyclo-olefin co-monomers whose chain structure is not broken but maintained in a main chain, a polymer having a substituent with a chain in an acryl branched chain, and a polymer having a substituent with a chain in a methacryl branched chain structure.

The above-described process may further include a soft-baking step before the exposing step (c) or a post-baking step after the exposing step (c). Preferably, the soft-baking step or post-baking step is performed at a temperature ranging from 70° C. to 200° C.

In the above exposure process, the light source is selected from the group consisting of ArF (193 nm), KrF (248 nm), $F_2$ (157 nm), EUV (13 nm), E-beam, X-ray, and ion-beam.

Additionally, the present invention provides a semiconductor device manufactured by the foregoing process.

The over-coating composition of the present invention will be described in more detail referring to the following non-limiting examples.

COMPARATIVE EXAMPLE 1

2.5 grams (g) of poly(acrylic acid/methyl methacrylate) (see SPIE, 2002, pp. 212-220) and 0.14 g of L-proline were added to 100 g of distilled water thereby obtaining an over-coating composition.

EXAMPLE 1

2.5 g of poly(acrylic acid/methyl methacrylate) and 0.14 g of 12-crown-4-ether were added to 100 g of distilled water, thereby obtaining an over-coating composition of the present invention.

EXAMPLE 2

2.5 g of poly(acrylic acid/methyl methacrylate) and 0.14 g of 15-crown-5-ether were added to 100 g of distilled water, thereby obtaining an over-coating composition of the present invention.

EXAMPLE 3

2.5 g of poly(acrylic acid/methyl methacrylate) and 0.14 g of salt of $NEt_3$ and $CH_3CO_2H$ ($Et_3N^+$ $^-O_2CCH_3$) were added to 100 g of distilled water, thereby obtaining an over-coating composition of the present invention.

COMPARATIVE EXAMPLE 2

Figure 2:
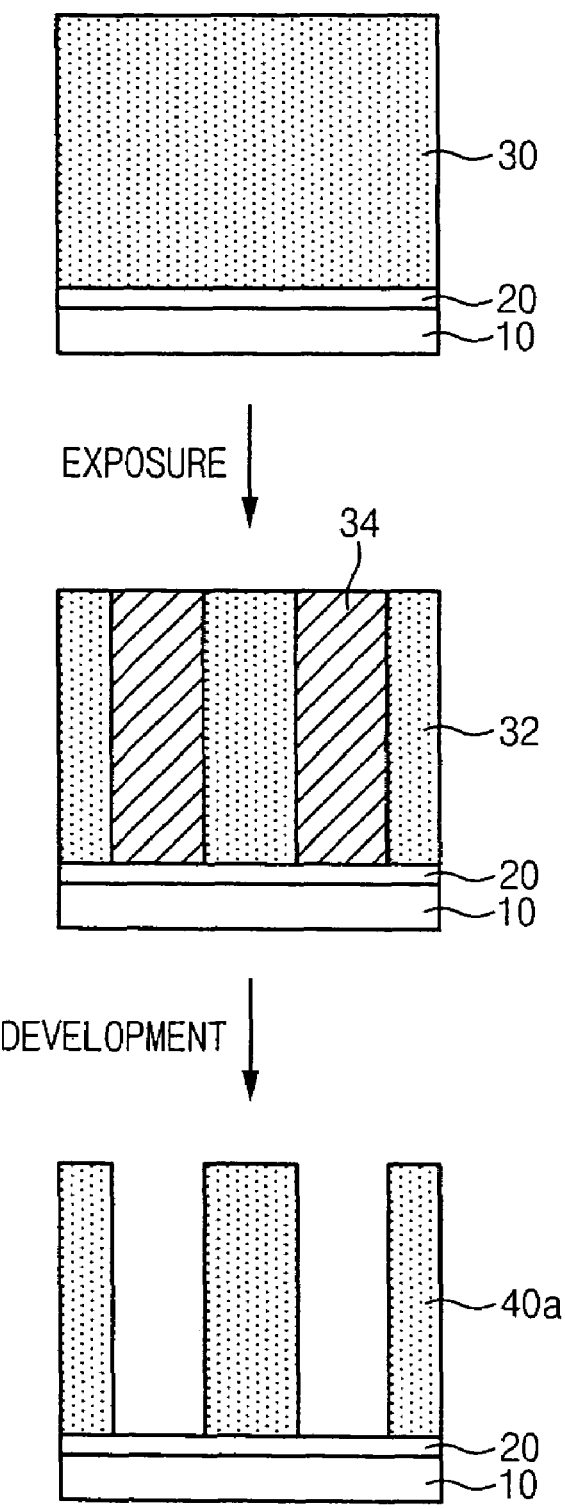
FIG. 2 is a diagram illustrating a process for forming a photoresist pattern obtained from Comparative Example 2.
Figure 5:
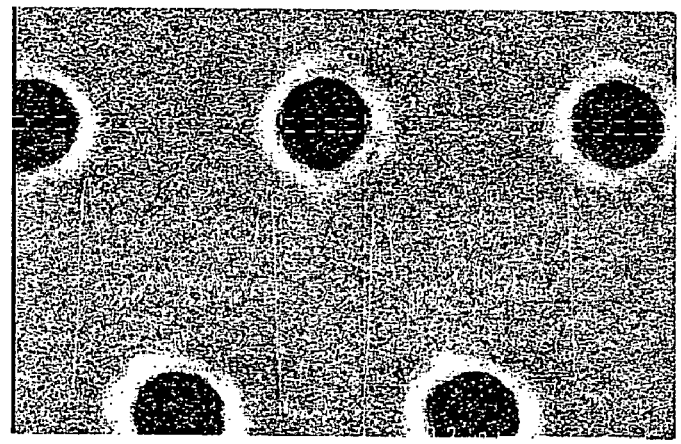
FIG. 5 is a SEM photograph of a photoresist pattern obtained from Comparative Example 2.

An organic scattered reflection protecting film composition (DHRC-20) (Dongjin SemiChem Co. Ltd.) was spin-coated on a semiconductor substrate 10, and baked at 240° C. for 90 seconds and cross-linked to form an organic-scattered, reflection-protecting film 20 having a thickness of 350 Å. A TarF__7039 (commercially available) photoresist produced by TOK Co., Ltd. comprising a PR polymer having a substituent with a chain in a methacryl branched chain was coated on the organic scattered reflection protecting film 20, and then baked at 120° C. for 90 seconds, thereby obtaining a photoresist film 30. After baking, the photoresist film 30 was exposed to light by using an ArF exposer of ASML Co., Ltd. to form an unexposed region 32 and an exposed region 34. The exposed region 34 was developed with a 2.38 wt % TMAH aqueous solution, thereby obtaining a photoresist pattern 40a (see FIG. 2). Shown in FIG. 5 is a SEM photograph of the photoresist pattern obtained from this Comparative Example 2, which shows a contact hole pattern of 120 nm.

COMPARATIVE EXAMPLE 3

An organic-scattered, reflection-protecting film composition (DHRC-20) (Dongjin SemiChem Co. Ltd.) was spin-coated on a semiconductor substrate 10, and baked at 240° C. for 90 seconds and cross-linked to form an organic-scattered, reflection-protecting film 20 having a thickness of 350 Å. A TarF__7039 (commercially available) photoresist produced by TOK Co., Ltd. comprising a PR polymer having a substituent with a chain in a methacryl branched chain was coated on the organic scattered reflection protecting film 20, and then baked at 120° C. for 90 seconds, thereby obtaining a photoresist film 30. After baking, the photoresist film 30 was exposed to light by using an ArF exposer of ASML Co., Ltd. to form an unexposed region 32 and an exposed region 34. The resulting mixture was under an alkali solution treatment by spraying with a 2.38 wt % TMAH aqueous solution, and then baked at 120° C. for 90 seconds.

Figure 3:
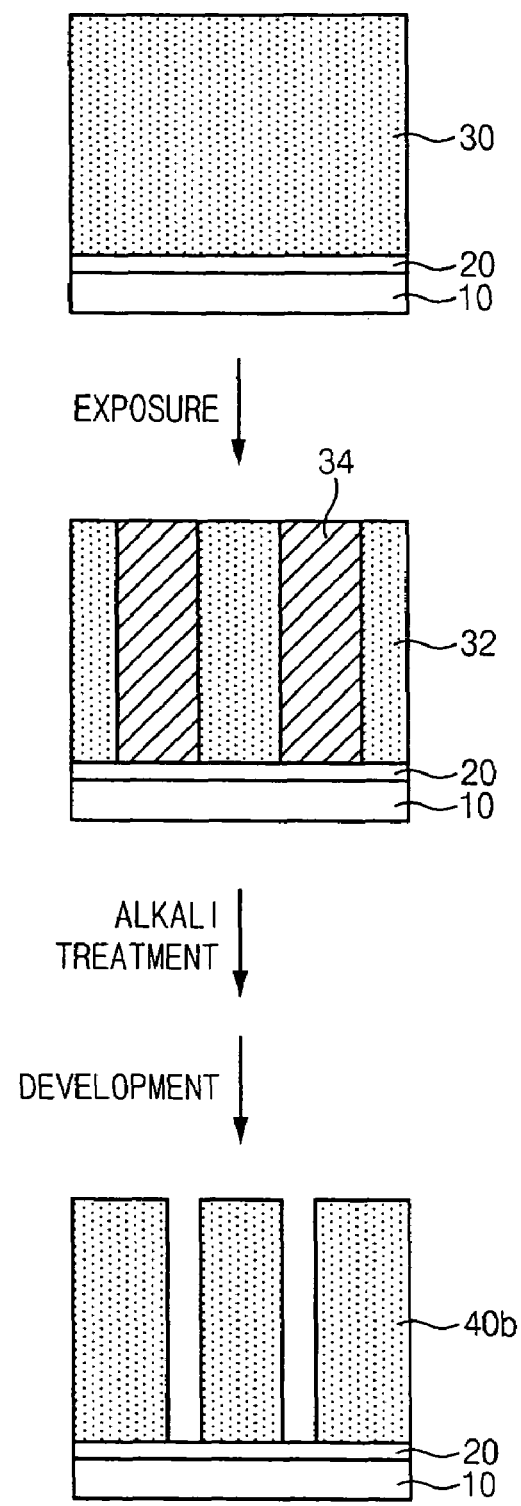
FIG. 3 is a diagram illustrating a process for forming a photoresist pattern obtained from Comparative Example 3.
Figure 6:
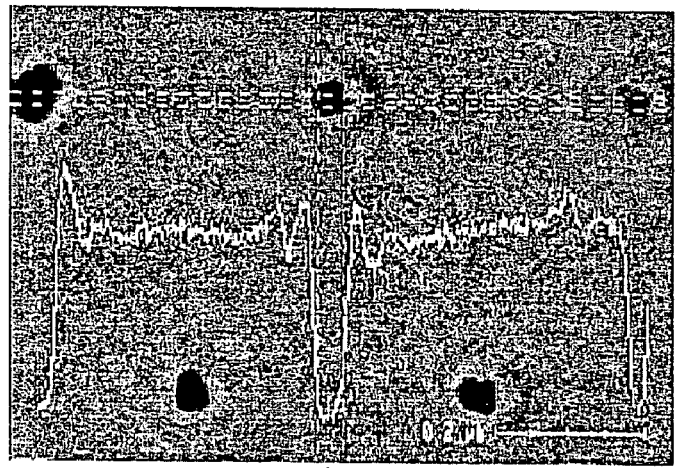
FIG. 6 is a SEM photograph of a photoresist pattern obtained from Comparative Example 3.

After baking, the exposed region 34 was developed with the 2.38 wt % TMAH aqueous solution, thereby obtaining a photoresist pattern 40b (see FIG. 3). FIG. 6 is a SEM photograph of the photoresist pattern obtained from this Comparative Example 3. In comparison with FIG. 5, FIG. 6 shows that the size of the contact hole was reduced but the contact hole was severely deformed due to uneven diffusion of the TMAH solution.

COMPARATIVE EXAMPLE 4

Figure 4:
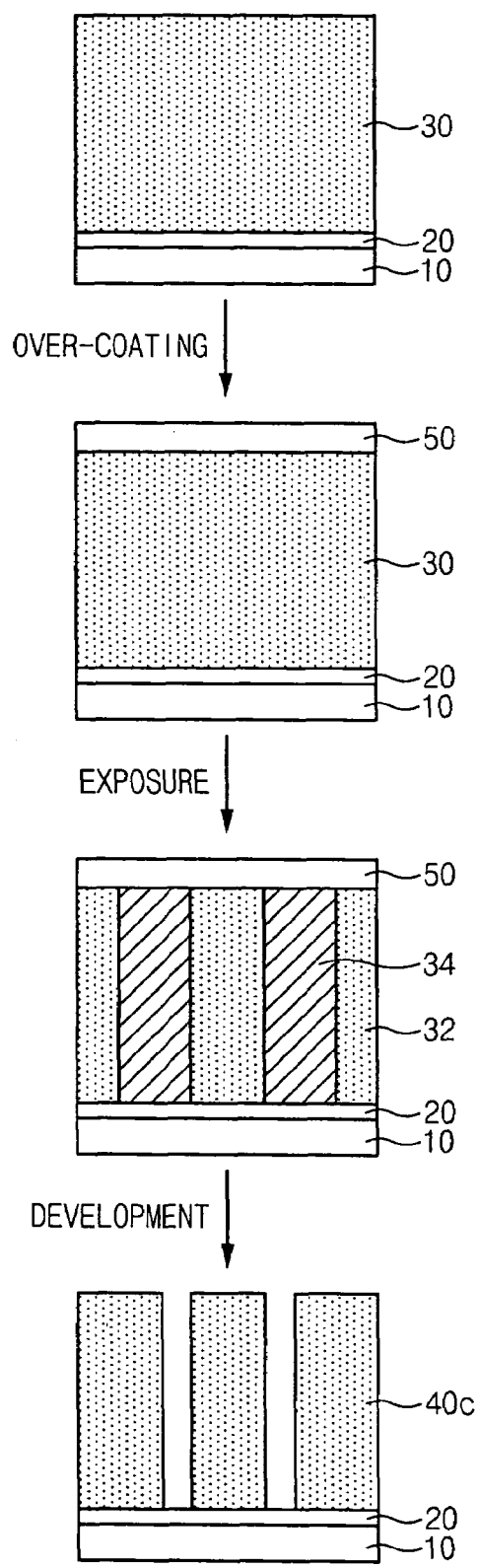
FIG. 4 is a diagram illustrating a process for forming a photoresist pattern obtained from Examples of the present invention.
Figure 7:
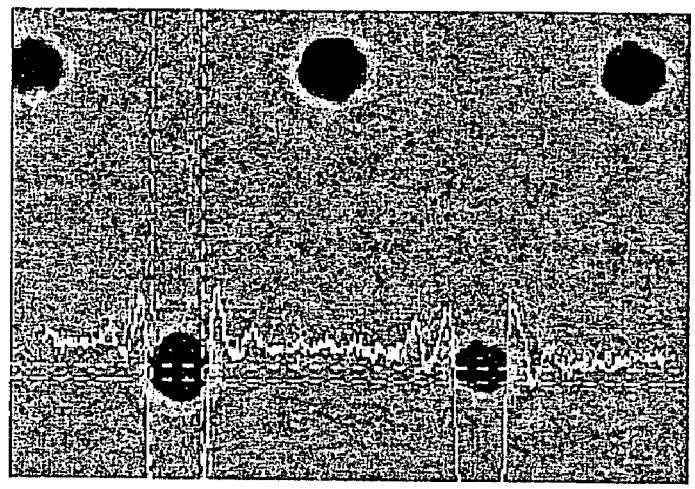
FIG. 7 is a SEM photograph of a photoresist pattern obtained from Comparative Example 4.

An organic-scattered, reflection-protecting film composition (DHRC-20) (Dongjin SemiChem Co. Ltd.) was spin-coated on a semiconductor substrate 10, and baked at 240° C. for 90 seconds and cross-linked to form an organic-scattered, reflection-protecting film 20 having a thickness of 350 Å. A TarF__7039 (commercially available) photoresist produced by TOK Co., Ltd. comprising a PR polymer having a substituent with a chain in a methacryl branched chain was coated on the organic scattered reflection protecting film 20, and then baked at 120° C. for 90 seconds, thereby obtaining a photoresist film 30. After baking, the over-coating composition obtained from Comparative Example 1 was coated on the photoresist film 30, and baked at 70° C. for 60 seconds, thereby obtaining an over-coating layer 50. After baking, the over-coating layer 50 was exposed to light by using an ArF exposer of ASML Co., Ltd. to form an unexposed region 32 and an exposed region 34. The exposed region 34 was developed with a 2.38 wt % TMAH aqueous solution, thereby obtaining a photoresist pattern 40c (see FIG. 4). Shown in FIG. 7 is a SEM photograph of a photoresist pattern obtained from Comparative Example 4. In comparison with FIG. 5, FIG. 7 shows that the size of the contact hole is reduced and uniform. However, it was expected that the photoresist pattern of this Comparative Example 4 would not be sufficient to be applied to actual process in the aspect of fidelity of the contact hole. That is, the same process as that of the Example 4 below was performed to form the photoresist pattern, except that L-proline as a kind of amino acid was added in the over-coating composition instead of a crown-ether compound or a salt compound.

EXAMPLE 4

Figure 8:
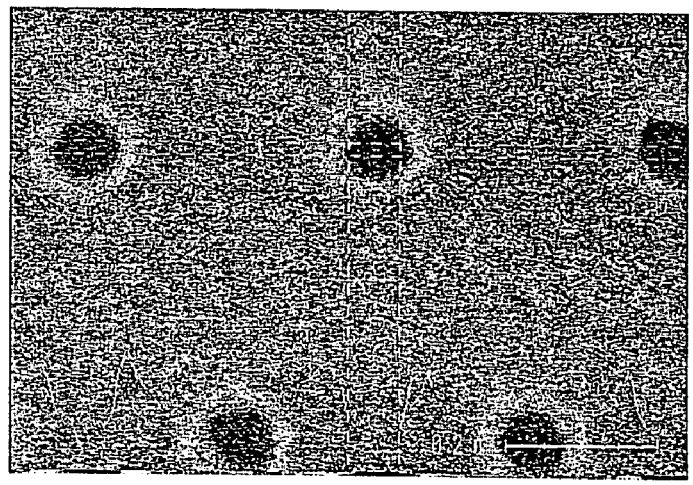
FIG. 8 is a SEM photograph of a photoresist pattern obtained from Example 4.

An organic-scattered, reflection-protecting film composition (DHRC-20) (Dongjin SemiChem Co. Ltd.) was spin-coated on a semiconductor substrate 10, and baked at 240° C. for 90 seconds and cross-linked to form an organic-scattered, reflection-protecting film 20 having a thickness of 350 Å. A TarF__7039 (commercially available) photoresist produced by TOK Co., Ltd. including a PR polymer having a substituent with a chain in a methacryl branched chain was coated on the organic-scattered, reflection-protecting film 20, and then baked at 120° C. for 90 seconds, thereby obtaining a photoresist film 30. After baking, the over-coating composition obtained from Example 1 was coated on the photoresist film 30, and baked at 70° C. for 60 seconds, thereby obtaining an over-coating layer 50. After baking the over-coating layer 50 was exposed to light by using an ArF exposer of ASML Co., Ltd. to form an unexposed region 32 and an exposed region 34. The exposed region 34 was developed with a 2.38 wt % TMAH aqueous solution, thereby obtaining a photoresist pattern 40c (see FIG. 4). Shown in FIG. 8 is a SEM photograph of the photoresist pattern obtained from Example 4. In comparison with FIG. 5, FIG. 8 shows that the size of the contact hole was reduced and uniform, so that the photoresist pattern of Example 4 may be applied to the actual process.

EXAMPLE 5

Figure 9:
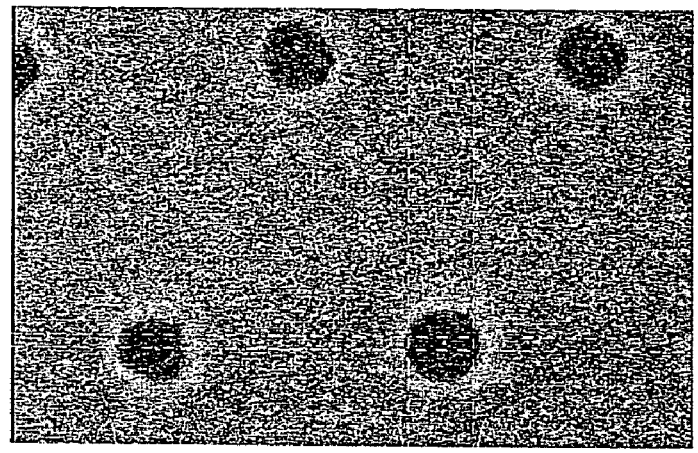
FIG. 9 is a SEM photograph of a photoresist pattern obtained from Example 5.

The same procedure of Example 4 was performed except that the over-coating composition of Example 2 was used instead of that of Example 1, thereby obtaining a photoresist pattern. Shown in FIG. 9 is a SEM photograph of the photoresist pattern obtained from Example 5. In comparison with FIG. 5, FIG. 9 shows that the size of the contact hole was reduced and uniform, so that the photoresist pattern of Example 5 may be applied to the actual process.

EXAMPLE 6

Figure 10:
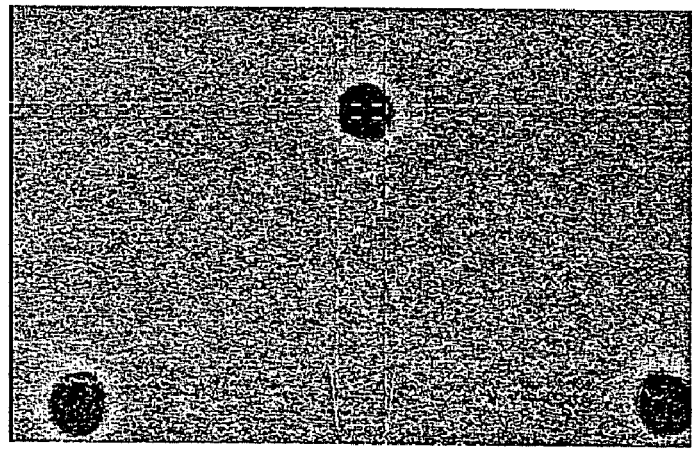
FIG. 10 is a SEM photograph of a photoresist pattern obtained from Example 6.

The same procedure of Example 4 was performed except that the over-coating composition of Example 3 was used instead of that of Example 1, thereby obtaining a photoresist pattern. Shown in FIG. 10 is a SEM photograph of the photoresist pattern obtained from Example 6. In comparison with FIG. 5, FIG. 10 shows that the size of the contact hole was reduced and uniform, so that the photoresist pattern of Example 6 may be applied to the actual process.

As discussed hereinbefore, the crown-ether compound in the over-coating composition of the present invention is uniformly diffused in the lower portion of the photoresist film, and neutralizes large amount of acids produced in the upper portion of the photoresist film, thereby uniformizing vertical distribution of the acids. As a result, vertical and fine patterns of less than 100 nm can be obtained.

What is claimed is:

1. An over-coating composition for a photoresist, the composition comprising (i) a crown-ether compound (ii) an alkali soluble resin including a repeating unit represented by Formula 2, and (iii) distilled water:

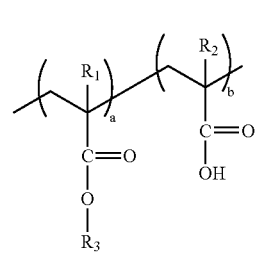

[Formula 2]

wherein
$R_1$ and $R_2$ are individually hydrogen or a methyl group;
$R_3$ is a linear or branched $C_1$-$C_{10}$ alkyl group; and
the relative ratio of a:b=2-20 mol %:80-90 mol %.

2. The composition according to claim 1, comprising a crown-ether compound selected from the group consisting of Formulas 3a to 3c:

[Formula 3a]

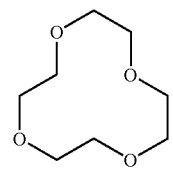

18-crown-6-ether

[Formula 3b]

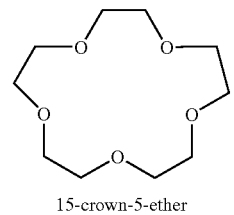

15-crown-5-ether

[Formula 3c]

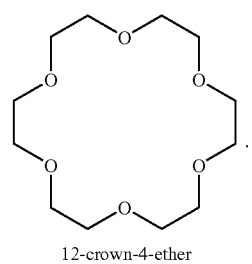

12-crown-4-ether

3. The composition according to claim 1, wherein the repeating unit of Formula 2 is poly(acrylic acid/methyl acrylate) or poly(acrylic acid/methyl methacrylate).

4. The composition according to claim 1, wherein the crown-ether compound is present in an amount ranging from 0.1 wt % to 10 wt %, based on the total amount of the composition, and the alkali soluble resin is present in an amount ranging from 1 wt % to 10 wt %, based on the total amount of the composition.

5. The composition according to claim 4, wherein the crown-ether compound is present in an amount ranging from 0.12 wt % to 2 wt %, based on the total amount of the composition, and the alkali soluble resin is present in an amount ranging from 2 wt % to 3 wt %, based on the total amount of the composition.

6. A process for forming a photoresist pattern, the process comprising the steps of:
 (a) coating an alkali-insoluble, chemical-amplification photoresist composition on a wafer to form a photoresist film;
 (b) coating the over-coating composition of claim 1 on the entire surface of the photoresist film to form an over-coating layer;
 (c) exposing the resulting structure to light; and,
 (d) developing the resulting structure to obtain a desired ultrafine pattern.

7. The process according to claim 6, further comprising forming reflection-protecting film on top portion of the wafer before forming a photoresist film in the step (a).

8. The process according to claim 6, further comprising a soft-baking step before the exposing step (c) or a post-baking step after the exposing step (c).

9. The process according to claim 8, wherein the soft-baking step or post-baking step is performed at a temperature ranging from 70° C. to 200° C.

10. The process according to claim 6, wherein the light is selected from the group consisting of ArF (193 nm), KrF (248 nm), $F_2$ (157 nm), EUV (13 nm), E-beam, X-ray, and ion-beam.

* * * * *